US009201113B2

(12) United States Patent
McCarthy et al.

(10) Patent No.: US 9,201,113 B2
(45) Date of Patent: Dec. 1, 2015

(54) SYSTEMS AND METHODS FOR PERFORMING REDUNDANCY TESTS ON TURBINE CONTROLS

(71) Applicant: General Electric Company, Schenectady, NY (US)

(72) Inventors: Kevin Thomas McCarthy, Troy, NY (US); Ayush Srivastava, Hyderabad (IN); Paul Venditti, Clifton Park, NY (US); Parag Arvind Marathe, Hyderabad (IN); Paul Thomas Schweitzer, Salem, VA (US)

(73) Assignee: General Electric Company, Schenectady, NY (US)

( * ) Notice: Subject to any disclaimer, the term of this patent is extended or adjusted under 35 U.S.C. 154(b) by 470 days.

(21) Appl. No.: 13/717,040

(22) Filed: Dec. 17, 2012

(65) Prior Publication Data

US 2014/0172346 A1   Jun. 19, 2014

(51) Int. Cl.
*G01R 31/28* (2006.01)
*G06F 15/00* (2006.01)
*F02C 9/00* (2006.01)

(52) U.S. Cl.
CPC . *G01R 31/28* (2013.01); *F02C 9/00* (2013.01); *F05D 2260/12* (2013.01); *F05D 2260/83* (2013.01); *F05D 2260/84* (2013.01)

(58) Field of Classification Search
CPC ... F02C 9/00; F05D 2260/12; F05D 2260/83; F05D 2260/84; G01R 31/28
USPC ............ 702/62, 117, 118, 183, 184, 188; 73/112.01; 340/579; 370/360; 700/287; 714/43
See application file for complete search history.

(56) References Cited

U.S. PATENT DOCUMENTS

| 4,051,669 | A |  | 10/1977 | Yannone et al. |
| 4,116,052 | A | * | 9/1978 | Paluka ....................... 73/112.01 |
| 4,642,782 | A |  | 2/1987 | Kemper et al. |
| 4,649,515 | A |  | 3/1987 | Thompson et al. |
| 5,508,897 | A |  | 4/1996 | Van Order |
| 5,634,008 | A |  | 5/1997 | Gaffaney et al. |
| 6,188,962 | B1 |  | 2/2001 | Morgan et al. |
| 6,199,018 | B1 |  | 3/2001 | Quist et al. |
| 6,268,853 | B1 |  | 7/2001 | Hoskins et al. |
| 6,356,199 | B1 | * | 3/2002 | Niziolek et al. .............. 340/579 |

(Continued)

FOREIGN PATENT DOCUMENTS

FR   2947080 A1   12/2010
WO   0150387 A1   7/2001

OTHER PUBLICATIONS

GE Industrial Systems GEI-100483A, SPEEDTRONIC™ Mark VI Turbine Control Product Description, Jan. 10, 2002, pp. 1-22, General Electric Company, Salem, VA, USA.

(Continued)

*Primary Examiner* — John H Le
(74) *Attorney, Agent, or Firm* — Armstrong Teasdale LLP (57) ABSTRACT

A computing device for use in performing a redundancy test on a turbine assembly and a turbine control system including a plurality of controllers each configured to independently control operation of the turbine assembly is provided. The computing device configured to be coupled to the turbine control system and configured to determine whether a plurality of test conditions are satisfied, display to a user an indication of which test conditions are satisfied, and test, in response to a user input, the plurality of controllers.

20 Claims, 6 Drawing Sheets

(56) References Cited

U.S. PATENT DOCUMENTS

| | | |
|---|---|---|
| 6,556,950 B1 | 4/2003 | Schwenke et al. |
| 6,615,090 B1 | 9/2003 | Blevins et al. |
| 6,618,856 B2 | 9/2003 | Coburn et al. |
| 6,633,782 B1 | 10/2003 | Schleiss et al. |
| 6,654,915 B1 | 11/2003 | Lu et al. |
| 6,671,659 B2 | 12/2003 | Troia et al. |
| 6,738,683 B1 | 5/2004 | Dunn |
| 6,862,553 B2 | 3/2005 | Schwenke et al. |
| 6,990,432 B1 | 1/2006 | McCarthy, IV et al. |
| 6,993,456 B2 | 1/2006 | Brooks et al. |
| 7,089,452 B2 | 8/2006 | Rubin et al. |
| 7,092,771 B2 | 8/2006 | Retlich et al. |
| 7,146,232 B2 | 12/2006 | Staron et al. |
| 7,162,695 B2 | 1/2007 | Zemore et al. |
| 7,213,065 B2 | 5/2007 | Watt |
| 7,228,187 B2 | 6/2007 | Tichy et al. |
| 7,266,476 B2 | 9/2007 | Coburn et al. |
| 7,305,272 B2 | 12/2007 | Maturana et al. |
| 7,324,856 B1 | 1/2008 | Bromley |
| 7,451,351 B2 | 11/2008 | Gunnmarker et al. |
| 7,546,232 B2 | 6/2009 | Brooks et al. |
| 7,640,291 B2 | 12/2009 | Maturana et al. |
| 7,702,487 B2 | 4/2010 | Sherrill et al. |
| 7,729,886 B2 | 6/2010 | Sherrill et al. |
| 7,729,887 B2 | 6/2010 | Sherrill et al. |
| 7,797,141 B2 | 9/2010 | O'Connell et al. |
| 7,840,336 B2 | 11/2010 | Muramatsu et al. |
| 7,953,844 B2 | 5/2011 | Deshpande |
| 8,250,914 B2 | 8/2012 | Sullivan |
| 8,260,441 B2 | 9/2012 | Scheegaβ et al. |
| 2002/0066054 A1 | 5/2002 | Jaw et al. |
| 2002/0077849 A1 | 6/2002 | Baruch et al. |
| 2002/0120921 A1 | 8/2002 | Coburn et al. |
| 2002/0169734 A1 | 11/2002 | Giel et al. |
| 2003/0126202 A1 | 7/2003 | Watt |
| 2003/0182083 A1 | 9/2003 | Schwenke et al. |
| 2003/0231200 A1 | 12/2003 | Zemore et al. |
| 2004/0073404 A1 | 4/2004 | Brooks et al. |
| 2004/0098148 A1 | 5/2004 | Retlich et al. |
| 2004/0204772 A1 | 10/2004 | Maturana et al. |
| 2004/0205412 A1 | 10/2004 | Staron et al. |
| 2004/0250168 A1 | 12/2004 | Tichy et al. |
| 2004/0268186 A1 | 12/2004 | Maturana et al. |
| 2005/0015680 A1 | 1/2005 | Rubin et al. |
| 2005/0278670 A1 | 12/2005 | Brooks et al. |
| 2006/0026035 A1 | 2/2006 | Younkes et al. |
| 2006/0126608 A1* | 6/2006 | Pereira et al. ............ 370/360 |
| 2007/0078628 A1 | 4/2007 | Virji et al. |
| 2007/0226543 A1* | 9/2007 | Young et al. ............ 714/43 |
| 2008/0141072 A1 | 6/2008 | Kalgren et al. |
| 2010/0082125 A1 | 4/2010 | Pingel et al. |
| 2010/0146078 A1 | 6/2010 | Wolff et al. |
| 2010/0146341 A1 | 6/2010 | Chen et al. |
| 2010/0222900 A1 | 9/2010 | Kakino et al. |
| 2011/0040577 A1 | 2/2011 | Ward |
| 2011/0059427 A1 | 3/2011 | Hans et al. |
| 2011/0071692 A1 | 3/2011 | D'Amato et al. |
| 2012/0016607 A1 | 1/2012 | Cottrell et al. |
| 2012/0126539 A1 | 5/2012 | Jacob |
| 2012/0130553 A1* | 5/2012 | Purani et al. ............ 700/287 |
| 2012/0275899 A1 | 11/2012 | Chandler |
| 2013/0332383 A1 | 12/2013 | Anzai et al. |
| 2014/0025414 A1 | 1/2014 | Worden et al. |

OTHER PUBLICATIONS

Non-Final Rejection towards corresponding application U.S. Appl. No. 13/557,153 dated Jul. 1, 2014.

International Search Report and Written Opinion issued in connection with corresponding PCT Application No. PCT/US2013/046491 dated Sep. 26, 2013.

Khan et al: "Risk-based maintenance: a quantitative approach for maintenance/inspection scheduling and planning", Journal of Loss Prevention Industries, vol. No. 16, Issue No. 6, pp. 561-573, Oct. 20, 2013.

International Search Report and Written Opinion issued in connection with corresponding PCT Application No. PCT/US2013/045353 dated Oct. 2, 2013.

International Search Report and Written Opinion issued in connection with corresponding PCT Application No. PCT/US2013/050478 dated Jun. 27, 2014.

* cited by examiner

SYSTEMS AND METHODS FOR PERFORMING REDUNDANCY TESTS ON TURBINE CONTROLS

BACKGROUND OF THE INVENTION

The subject matter disclosed herein relates generally to turbine assemblies, and more specifically, to systems and methods for use in assisting users in performing redundancy checks on turbine assembly control systems.

At least some known turbine systems use a control system that monitors and/or controls the operation of a turbine assembly. At least some known control systems include a plurality of controllers for use in controlling the turbine assembly. In a redundant control system, each controller can independently operate the turbine assembly. Accordingly, even if a controller fails, the control system may remain operational.

To ensure proper operation of at least some known control systems, periodic redundancy tests may be performed that simulate faults of one or more controllers such that failure may be predicted before an actual breakdown. Known redundancy tests may include a plurality of relatively complicated steps. Accordingly, to effectively and accurately perform the redundancy test, operators may require extensive training and experience. Thus, in at least some known turbine systems, inexperienced operators may be unable to properly perform redundancy tests on control systems.

BRIEF DESCRIPTION OF THE INVENTION

In one aspect, a computing device for use in performing a redundancy test on a turbine assembly and a turbine control system including a plurality of controllers each configured to independently control operation of the turbine assembly is provided. The computing device configured to be coupled to the turbine control system and configured to determine whether a plurality of test conditions are satisfied, display to a user an indication of which test conditions are satisfied, and test, in response to a user input, the plurality of controllers.

In another aspect, a computing device for assisting a user in performing a redundancy test on a plurality of controllers in a control system is provided. The computing device includes a processing device configured to determine whether a plurality of test conditions are satisfied, a presentation interface coupled to the processing device and configured to display to the user an indication of which test conditions are satisfied, and a user input interface coupled to the processing device and configured to receive input from the user that initializes testing of the plurality of controllers.

In yet another aspect, a method for assisting a user in performing a redundancy test on a plurality of controllers in a control system is provided. The method includes determining, using a processing device, whether a plurality of test conditions are satisfied, displaying to the user, on a presentation interface coupled to the processing device, an indication of which test conditions are satisfied, and receiving, at a user input interface coupled to the processing device, input from the user that initializes testing of the plurality of controllers.

DETAILED DESCRIPTION OF THE INVENTION

The systems and methods described herein enable redundancy tests to be performed on a plurality of controllers in a turbine assembly control system. A redundancy test wizard, operating on a computing device, automatically determines whether the redundancy test conditions are satisfied. The redundancy test wizard also displays information that indicates which test conditions are satisfied. After all test conditions are satisfied, the redundancy test wizard enables a user to initiate selective testing of each of the plurality of controllers.

Technical effects of the methods and systems described herein include at least one of: (a) determining whether a plurality of test conditions are satisfied; (b) displaying to a user an indication of which test conditions are satisfied; and (c) receiving input from the user that initializes testing of the plurality of controllers.

Figure 1:
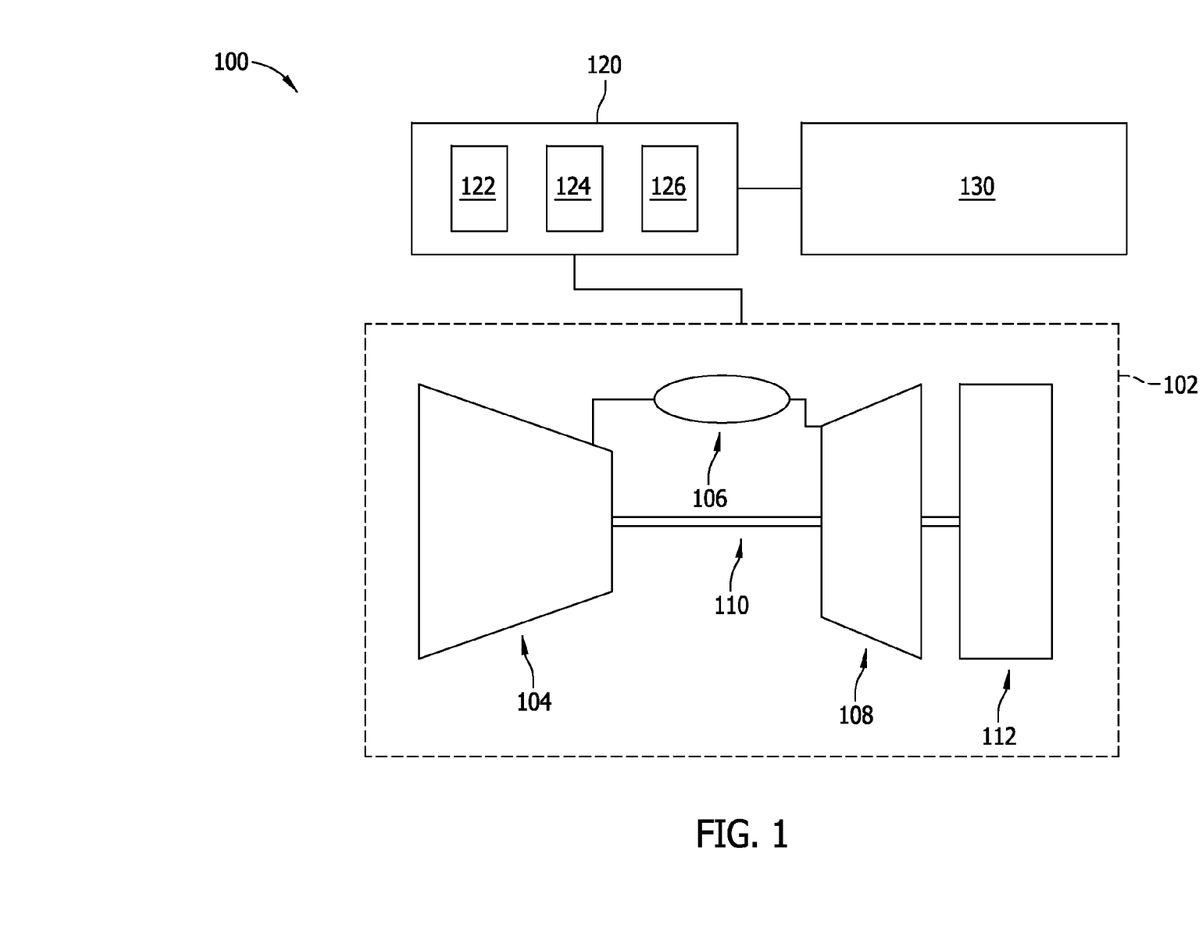
FIG. 1 is a schematic diagram of an exemplary turbine system.

FIG. 1 is a schematic diagram of an exemplary turbine system 100. In the exemplary embodiment, turbine system includes a turbine assembly 102 that includes, coupled in a serial flow arrangement, a compressor 104, a combustor assembly 106, and a turbine 108 that is rotatably coupled to compressor 104 via a rotor shaft 110. While turbine system 100 is a gas turbine system in the exemplary embodiment, alternatively, turbine system 100 may be a steam turbine.

During operation, in the exemplary embodiment, ambient air is channeled through an air inlet (not shown) towards compressor 104. The ambient air is compressed by compressor 104 prior it to being channeled towards combustor assembly 106. In the exemplary embodiment, compressed air is mixed with fuel, and the resulting fuel-air mixture is ignited within combustor assembly 106 to generate combustion gases that are directed towards turbine 108. Moreover, in the exemplary embodiment, turbine 108 extracts rotational energy from the combustion gases and rotates rotor shaft 110 to drive compressor 104. Furthermore, in the exemplary embodiment, turbine assembly 100 drives a load 112, such as a generator, coupled to rotor shaft 110. In the exemplary embodiment, load 112 is downstream of turbine assembly 100. Alternatively, load 112 may be upstream from turbine assembly 102.

A control system 120 is coupled to turbine assembly 102. Control system 120 facilitates controlling and monitoring operation of turbine assembly 102. In the exemplary embodiment, control system 120 is a triple modular redundant (TMR) control system that includes a first controller 122, a second controller 124, and a third controller 126. First, second, and third controllers 122, 124, and 126, respectively, each operate independently from one another and each includes its own power supply (not shown). As used herein, the term 'controller' refers to a controller core including the actual controller, input/processing, the power supply, communication devices, etc. Accordingly failure of a controller may include failure of one or more of these controller core components.

Accordingly, in the exemplary embodiment, in the event that one of controllers 122, 124, and 126 fail, the remaining controllers can still maintain safe and continuous operation of turbine assembly 102, so long as two of controllers 122, 124, and 126 do not fail. In at least some embodiments, control system 120 is a Mark V, Mark VI, or Mark VIe turbine control system manufactured by General Electric. Alternatively, control system 120 may be any control system that enables turbine system 100 to function as described herein. For example, in some embodiments, control system 120 includes more or less than three controllers.

To ensure proper operation of control system 120, an operator or user (not shown in FIG. 1) may periodically subject control system 120 to a redundancy test. During the redundancy test, one or more faults of control system 120 are simulated to determine whether control system 120 is capable of maintaining operation of turbine assembly 102 during faults. That is, conditions and/or events may undermine the effectiveness of control system 120, and cause control system 120 to be a single fault event away from being unable to maintain safe and continuous operation of turbine assembly 10. Performing the redundancy test facilitates detecting such conditions and/or events in a methodical and controlled way. The redundancy test may be performed on-line (i.e., while turbine assembly 100 is operating) or off-line.

The redundancy test generally includes a plurality of different steps, which may be difficult for an operator to remember and/or to execute without adequate instructions. Accordingly, in the exemplary embodiment, a computing device 130 coupled to control system 120 facilitates aiding an operator in conducting redundancy tests on control system 120, as described in detail below. In the exemplary embodiment, computing device 130 is a separate component from control system 120. Alternatively, computing device 130 and control system 120 may both be implemented in the same hardware device.

Figure 2:
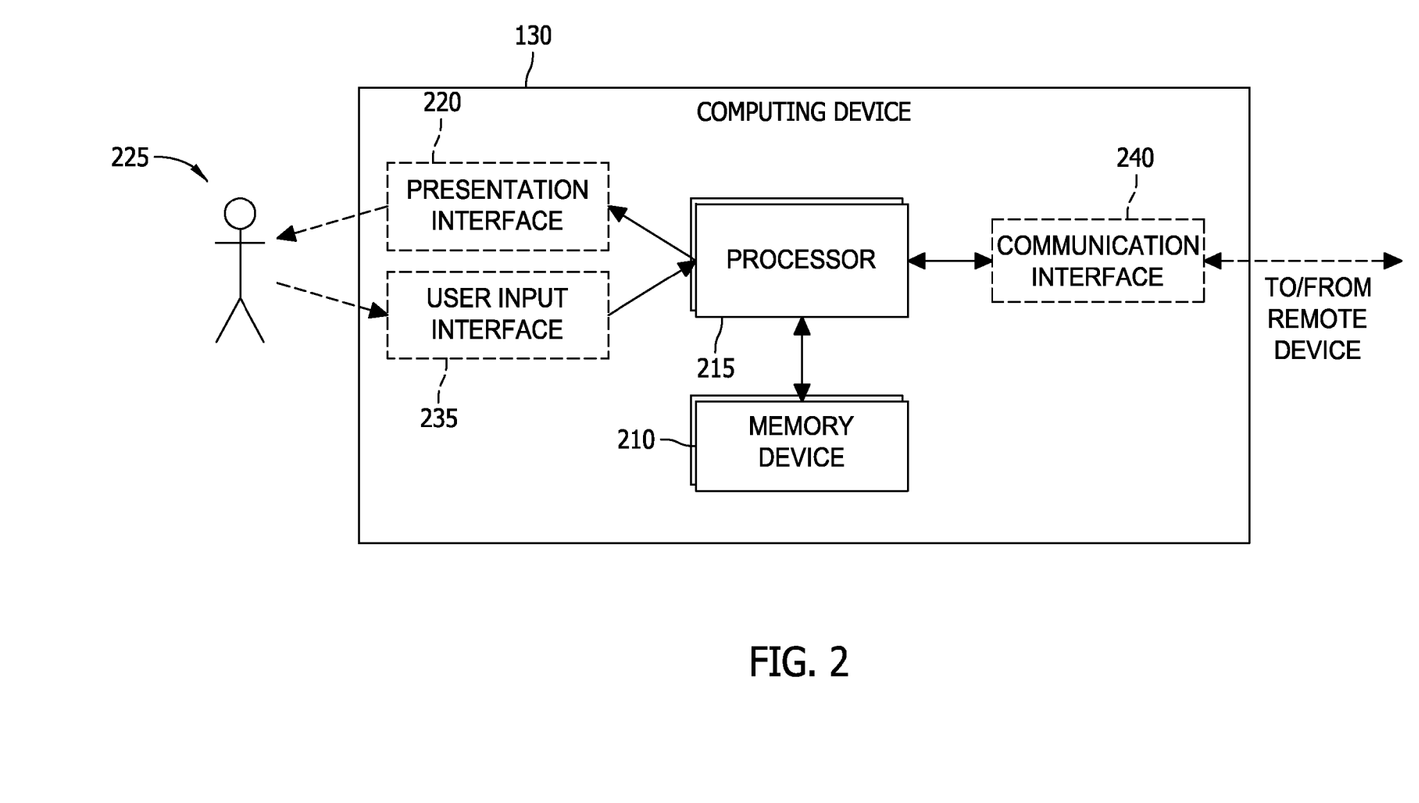
FIG. 2 is a block diagram of an exemplary computing device that may be used to control the turbine system shown in FIG. 1.

FIG. 2 is a block diagram of computing device 130. Computing device 130 includes at least one memory device 210 and a processor 215 that is coupled to memory device 210 for executing instructions. In some embodiments, executable instructions are stored in memory device 210. In the exemplary embodiment, computing device 130 performs one or more operations described herein by programming processor 215. For example, processor 215 may be programmed by encoding an operation as one or more executable instructions and by providing the executable instructions in memory device 210.

Processor 215 may include one or more processing units (e.g., in a multi-core configuration). Further, processor 215 may be implemented using one or more heterogeneous processor systems in which a main processor is present with secondary processors on a single chip. As another illustrative example, processor 215 may be a symmetric multi-processor system containing multiple processors of the same type. Further, processor 215 may be implemented using any suitable programmable circuit including one or more systems and microcontrollers, microprocessors, reduced instruction set circuits (RISC), application specific integrated circuits (ASIC), programmable logic circuits, field programmable gate arrays (FPGA), and any other circuit capable of executing the functions described herein.

In the exemplary embodiment, memory device 210 is one or more devices that enable information such as executable instructions and/or other data to be stored and retrieved. Memory device 210 may include one or more computer readable media, such as, without limitation, dynamic random access memory (DRAM), static random access memory (SRAM), a solid state disk, and/or a hard disk. Memory device 210 may be configured to store, without limitation, application source code, application object code, source code portions of interest, object code portions of interest, configuration data, execution events and/or any other type of data.

In some embodiments, computing device 130 includes a presentation interface 220 that is coupled to processor 215. Presentation interface 220 presents information, such as application source code and/or execution events, to a user or operator 225. For example, presentation interface 220 may include a display adapter (not shown) that may be coupled to a display device, such as a cathode ray tube (CRT), a liquid crystal display (LCD), an organic LED (OLED) display, and/or an "electronic ink" display. In some embodiments, presentation interface 220 includes one or more display devices.

In the exemplary embodiment, computing device 130 includes a user input interface 235. In the exemplary embodiment, user input interface 235 is coupled to processor 215 and receives input from user 225. User input interface 235 may include, for example, a keyboard, a pointing device, a mouse, a stylus, a touch sensitive panel (e.g., a touch pad or a touch screen), a gyroscope, an accelerometer, a position detector, and/or an audio user input interface. A single component, such as a touch screen, may function as both a display device of presentation interface 220 and user input interface 235.

In some embodiments, computing device 130 includes a communication interface 240 coupled to processor 215. Communication interface 240 communicates with one or more remote devices. To communicate with remote devices, communication interface 240 may include, for example, a wired network adapter, a wireless network adapter, and/or a mobile telecommunications adapter. In the exemplary embodiment, unless otherwise noted, processor 215 facilitates walking an operator through a redundancy test using a redundancy test wizard. In the exemplary embodiment, the redundancy test wizard is a program stored on a computer readable medium (such as memory device 210) and executed by processor 215.

Figure 3:
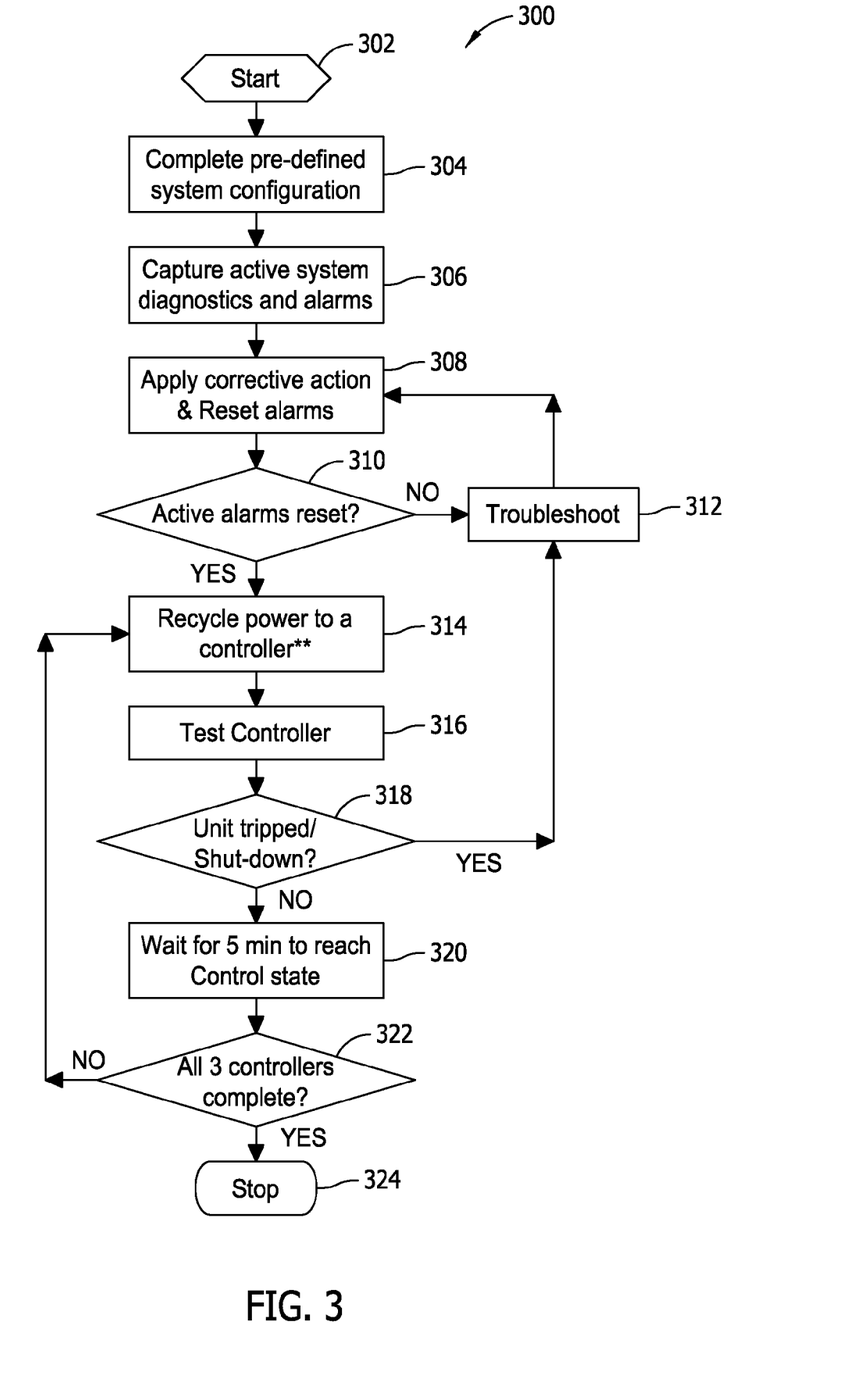
FIG. 3 is a flowchart of an exemplary turbine redundancy test that may be implemented using the system shown in FIG. 1.

FIG. 3 is a flowchart 300 of an exemplary redundancy test that may be used with turbine system 100 (shown in FIG. 1). After starting 302 the redundancy test, the turbine system 100 must be prepared before actually testing first, second, and third controllers 122, 124, and 126 (shown in FIG. 1). In the exemplary embodiment, a pre-defined system configuration is completed 304 and active system diagnostics and alarms are captured 306 in preparation.

Completing 304 a pre-defined system configuration includes selecting a trend to be used for the redundancy test and starting a trend recorder in the exemplary embodiment. The trend is selected based on the type of turbine 108 (shown in FIG. 1), and is selected by user 225 in the exemplary embodiment. Alternatively, computing device 130 may automatically (i.e., without input from user 225) select the trend. The trend recorder logs the events and/or actions that take place as part of the redundancy test.

Capturing 306 active diagnostics and alarms includes, in the exemplary embodiment, reviewing any standing or intermittent process alarms for control system 120, reviewing any standing or intermittent diagnostic alarms for control system 120, verifying the controllers are operating in an appropriate control state, and verifying that historical alarm data is being stored correctly. In the exemplary embodiment, each controller is deemed to be operating in an appropriate control state if the controller is running with code equal to an .m6b file. Further, in the exemplary embodiment, historical alarm data is stored in .d03 files. Alternatively, capturing 306 active diagnostics and alarms includes any processes and/or analysis that enables turbine system 100 to function as described herein.

If any outstanding alarms and/or issues are identified during capturing 306, corrective action is applied 308 in an attempt to reset the outstanding alarms and eliminate the issues. After applying 308 corrective action, it is determined 310 whether all outstanding alarms have been reset. In the exemplary embodiment, without any input from user 225, computing device 130 automatically determines 310 whether all outstanding alarms have been reset. Alternatively, user 225 may determine 310 whether all outstanding alarms have been reset, and may indicate whether all outstanding alarms have been rest using user input interface 235.

If all outstanding alarms have not been reset, troubleshooting 312 is performed to attempt to identify why any alarms have not been reset, and as a result of troubleshooting 312, corrective action is applied 308 in an attempt to reset the outstanding alarms and eliminate the issues. Troubleshooting 312 may include computing device 130 performing an automatic diagnostic scan on control system 120 to determine why one or more alarms are not reset and/or may include computing device 130 walking user 225 through a set of questions and/or instructions to troubleshoot 312.

If it is determined 310 that all outstanding alarms have been reset, computing device 130 and/or user 225 instruct control system 120 to recycle 314 power to a one of controllers 122, 124, and 126. The powered controller is then tested 316 according to the selected trend. Testing 316 a powered controller may include running failure simulations on the powered controller, powering on and off the other controllers, running the powered controller through a power up sequence, and/or any other process that enables determining whether the powered controller is operating properly. Computing device 130 and/or user 225 determine 318 whether the powered controller and/or control system 120 tripped and/or shut down during testing 316. If powered controller and/or control system 120 did fail (i.e., tripped and/or shut down), troubleshooting 312 is conducted, similar to above, to determine the cause of the failure.

If computing device 130 and/or user 225 determine 318 that no failure occurred, control system 120 is reset by waiting 320 a predetermined period of time. In the exemplary embodiment, computing device 130 instructs user 225 to wait 320 the predetermined period of time and/or prohibits user 225 from proceeding with the redundancy test during the predetermined period of time. In the exemplary embodiment, the predetermined period of time is five minutes. Alternatively, the predetermined period is any length of time that enables the powered controller and computing device 130 to reset.

Once the predetermined time period is over, computing device 130 and/or user determines 322 whether all controllers 122, 124, and 126 have been tested 316. If any of controllers 122, 124, and 126 remain untested, the process is repeated until all controllers 122, 124, and 126 are tested 316. If all controllers 122, 124, and 126 have completed testing 316, the redundancy test ends 324.

Figure 4:
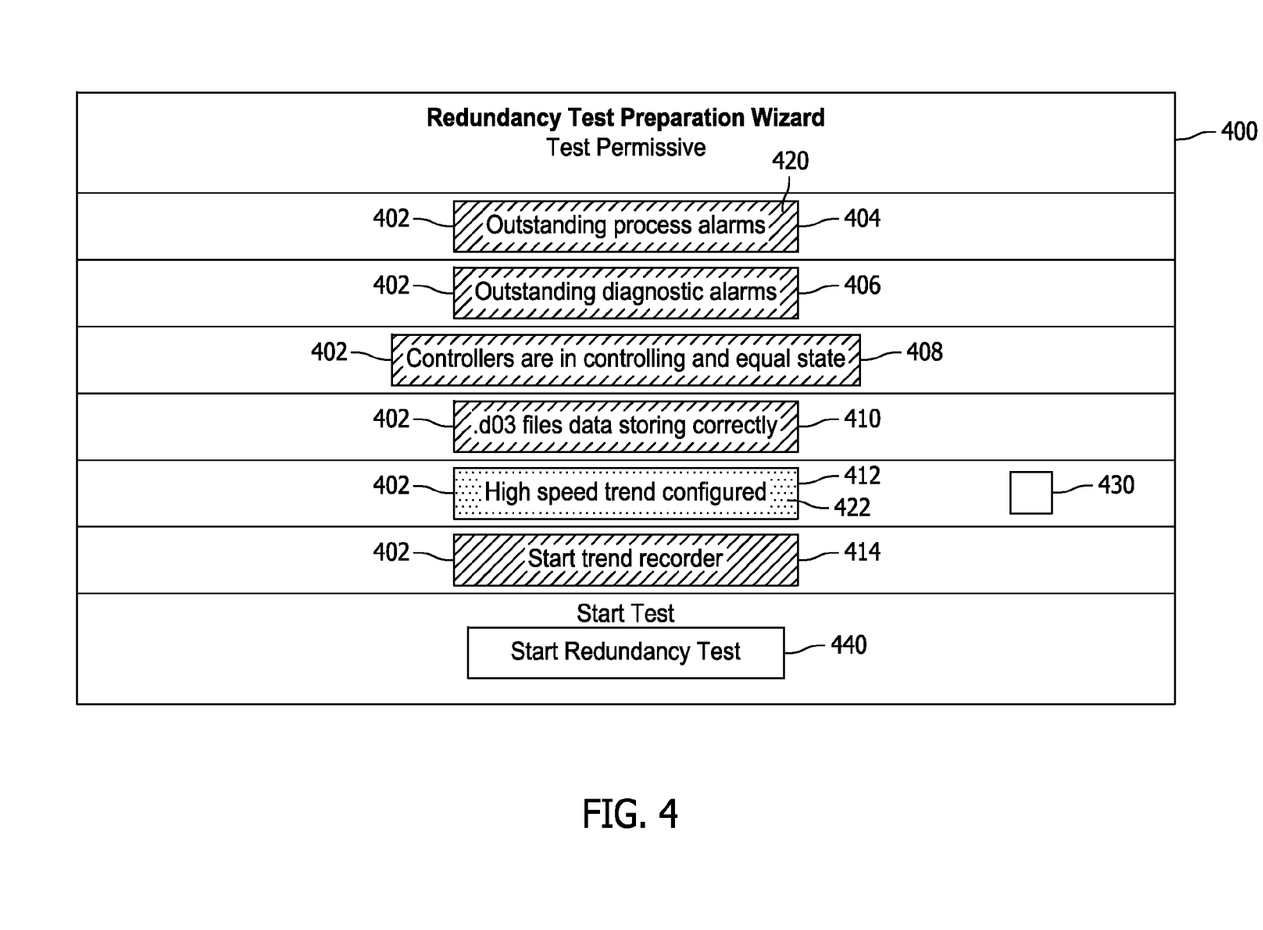
FIGS. 4-7 are exemplary screenshots of a turbine redundancy test wizard that may be displayed using the computing device shown in FIG. 2.

FIG. 4 is an exemplary screenshot 400 that may be displayed on presentation interface 220 of computing device 130 (both shown in FIG. 2). In the exemplary embodiment, screenshot 400 is displayed to user 225 (shown in FIG. 2) as part of the redundancy test wizard.

Screenshot 400 displays a plurality of test conditions 402 that must be satisfied before user 225 can begin actually testing controllers 122, 124, and 126 (shown in FIG. 1). Test conditions 402 include, in the exemplary embodiment, an outstanding process alarms test condition 404, an outstanding diagnostic alarms test condition 406, a controllers in controlling and equal state test condition 408, a .do3 file storing test condition 410, a high spend trend configuration test condition 412, and a start trend recorder test condition 414. To indicate whether a test condition 402 has been satisfied, in the exemplary embodiment, test conditions are displayed using one of a first indicator 420 and a second indicator 422. First and second indicators 420 and 422 may include highlighting test conditions 402 in a predetermined color, applying predetermined formatting to test conditions 402 (e.g., bolding, italicizing, etc.), displaying icons next to test conditions 402, and/or any other effect that enables user 225 to identify which test conditions 402 have been satisfied by viewing screenshot 400. For example, in one embodiment, first indicator 420 is green highlighting applied to test conditions 402 that are satisfied, and second indicator 422 is red highlighting applied to test conditions 402 that are unsatisfied.

Outstanding process alarms test condition 404, outstanding diagnostic alarms test condition 406, and controllers in controlling and equal state test condition 408 are related to capturing 306 active diagnostics and alarms (shown in FIG. 3). Specifically, outstanding process alarms test condition 404 is satisfied when no outstanding diagnostic alarms remain, outstanding diagnostic alarms test condition 406 is satisfied when no outstanding process alarms remain, .do3 file storing test condition 410 is satisfied when historical alarm data is being stored properly, and controllers in controlling and equal state test condition 408 is satisfied when controllers 122, 124, and 126 are in a controlling and equal state.

High speed trend configuration test condition 412 and start trend recorder test condition 414 are related to completing 304 a pre-defined system configuration (shown in FIG. 3). Specifically, in the exemplary embodiment, high speed trend configuration test condition 412 is satisfied when user 225 selects a trend. Accordingly, screenshot 400 includes a check box 430 that user 225 may check using, for example, user input interface 235 (shown in FIG. 2). Once user 225 checks check box 430 to indicate a trend has been selected, high speed trend configuration test condition 412 is satisfied. Start trend recorder test condition 414 is satisfied when the trend recorder has been started.

In the exemplary embodiment, computing device 130 is capable of automatically (i.e., without input from user 225) determining whether all test conditions 402, with the exception of high speed trend configuration test condition 412, have been satisfied. Alternatively, computing device 130 may be capable of automatically determining whether any combination of test conditions 402 are satisfied. As used herein, a combination of test conditions 402 may include none, one, or a plurality of test conditions 402. In the exemplary embodiment, once all test conditions 402 are satisfied, user 225 initiates the testing of controllers 122, 124, and 126 by selecting a start redundancy test button 440 using user input interface 235.

Figure 5:
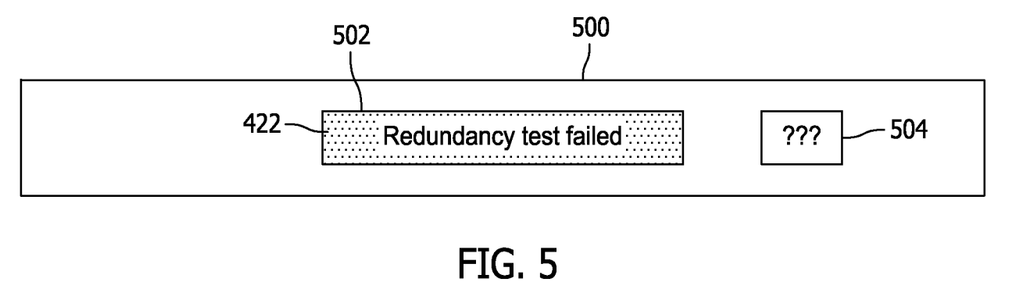

FIG. 5 is an exemplary screenshot 500 that may be displayed on presentation interface 220 of computing device 130 (both shown in FIG. 2) to indicate that the redundancy test failed. In the exemplary embodiment, screenshot 500 includes a redundancy test failed message 502 that includes second indicator 422. By selecting a help button 504, user 225 can view more information on the failed redundancy test.

Figure 6:
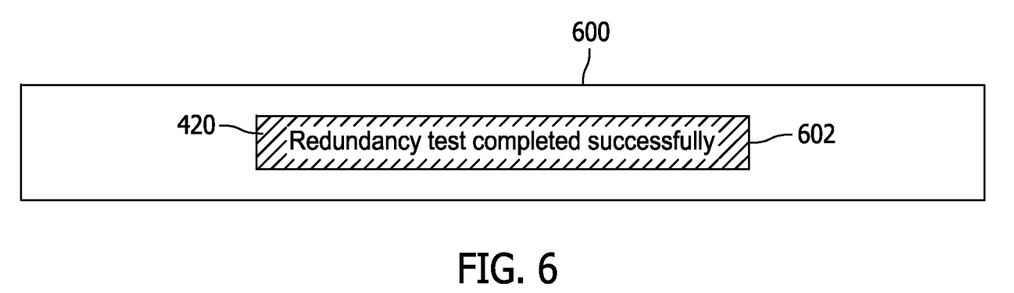

FIG. 6 is an exemplary screenshot 600 that may be displayed on presentation interface 220 of computing device 130 (both shown in FIG. 2) to indicate that the redundancy test was successful. In the exemplary embodiment, screenshot 500 includes a redundancy test successful message 602 that includes first indicator 420.

Figure 7:
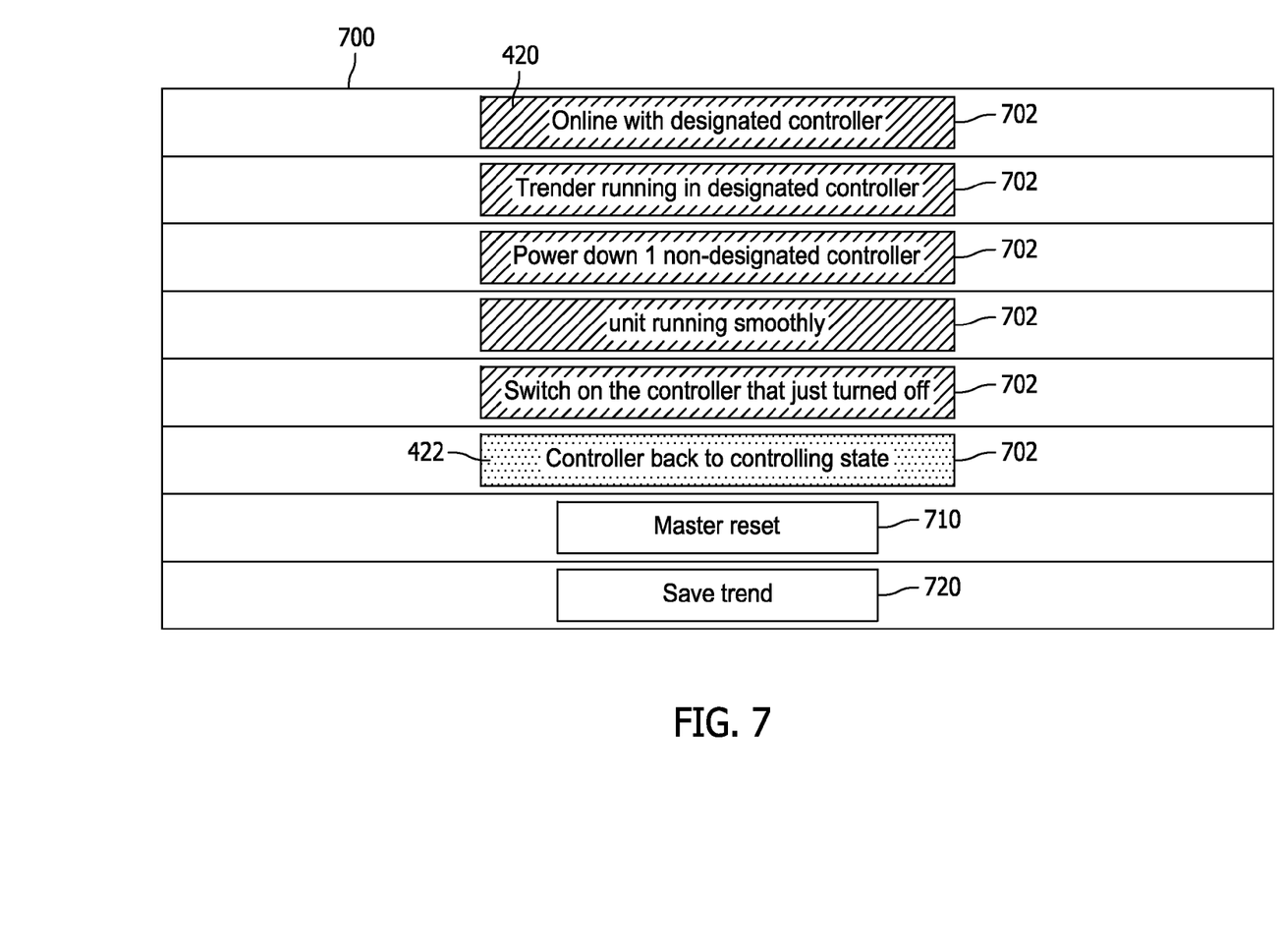

FIG. 7 is an exemplary screenshot 700 that may be displayed on presentation interface 220 of computing device 130 (both shown in FIG. 2) when user 225 selects help button 504 (shown in FIG. 5). Screenshot 700 includes a list of events 702 occur during a successful redundancy test. In the exemplary embodiment, events 702 correspond to events stored in the trend recorder. Each event 702 includes either first indicator 420 to indicate event 702 occurred during the redundancy test or second indicator 422 to indicate event 702 did not occur during the redundancy test. For example, in screenshot 700, the tested controller did not properly return to a controlling state. Accordingly, the associated event 702 includes second indicator 422.

In the exemplary embodiment, screenshot 700 includes a master reset button 710 and a save trend button 720. When user 225 selects master reset button 710 control system 120 (shown in FIG. 1) is reset. When user 225 selects save trend button 720, the data in trend recorder for the failed redundancy test is saved to a storage device, such as memory 210 (shown in FIG. 2).

As compared to known turbine systems, the systems and methods described herein assist a user in performing a redundancy test on a plurality of controllers. Accordingly, unlike at least some known turbine systems that require operators to possess extensive knowledge and/or experience, the systems and methods described herein enable relatively inexperienced operators to successfully perform redundancy tests. By automatically detecting whether test conditions are satisfied, and presenting satisfied and unsatisfied test conditions to the user in a generally simple and straightforward format, the redundancy test wizard significantly simplifies the process for the operator as compared to known turbine systems, thus allowing redundancy tests to be performed more efficiently, accurately, and more frequently. Further, as compared to at least some known redundancy tests which may only be performed while a turbine assembly is off-line, the methods and systems described herein enable performing a redundancy test during turbine assembly operation.

The embodiments described herein enable redundancy tests to be performed on a plurality of controllers in a turbine assembly control system. A redundancy test wizard, operating on a computing device, automatically determines whether the redundancy test conditions are satisfied. The redundancy test wizard also displays information that indicates which test conditions are satisfied. After all test conditions are satisfied, the redundancy test wizard enables a user to initiate selective testing of each of the plurality of controllers.

Exemplary embodiments of systems and methods for assisting in performance of a redundancy test are described above in detail. The systems and methods described herein are not limited to the specific embodiments described herein, but rather, components of the systems and/or steps of the methods may be utilized independently and separately from other components and/or steps described herein. For example, the systems and methods described herein are not limited to use with redundancy tests for turbine control systems, but may be used with control systems in a number of different industrial applications, Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computing device for use in performing a redundancy test on a turbine assembly and a turbine control system including a plurality of controllers each configured to independently control operation of the turbine assembly, said computing device configured to be coupled to the turbine control system and configured to:
   determine whether a plurality of test conditions are satisfied;
   display to a user an indication of which test conditions are satisfied; and
   test, in response to a user input, the plurality of controllers.

2. A computing device in accordance with claim 1, wherein the computing device is configured to be coupled to a triple modular redundant control system including three controllers.

3. A computing device in accordance with claim 1, wherein to determine whether a plurality of test conditions are satisfied, said computing device is configured to:
   determine whether a pre-defined system configuration is complete; and
   determine whether there are any outstanding alarms.

4. A computing device in accordance with claim 1, wherein to display an indication of which test conditions are satisfied, said computing device is configured to:
   display satisfied test conditions with a first indicator; and
   display unsatisfied test conditions with a second indicator.

5. A computing device in accordance with claim 4, wherein the first and second indicators each include at least one of a color and a formatting applied to an associated test condition.

6. A computing device in accordance with claim 1, wherein said computing device is further configured to guide the user through a troubleshooting process when the redundancy test fails.

7. A computing device in accordance with claim 1, wherein said computing device is further configured to:
   display a message indicating the redundancy test failed when the redundancy test indicates that the plurality of controllers are not capable of maintaining safe and continuous operation in the event of one or more faults within the control system; and
   display a message indicating the redundancy test was successfully completed when the redundancy test indicates that the plurality of controllers are capable of maintaining safe and continuous operation in the event of one or more faults within the control system.

8. A computing device in accordance with claim 1, wherein said computing device is further configured to display information that indicates why the redundancy test failed.

9. A computing device for assisting a user in performing a redundancy test on a plurality of controllers in a control system, said computing device comprising:
   a processing device configured to determine whether a plurality of test conditions are satisfied;
   a presentation interface coupled to said processing device and configured to display to the user an indication of which test conditions are satisfied; and
   a user input interface coupled to said processing device and configured to receive input from the user that initializes testing of the plurality of controllers.

10. A computing device in accordance with claim 9, wherein to determine whether a plurality of test conditions are satisfied, said processing device is configured to:
- determine whether a pre-defined system configuration is complete; and
- determine whether there are any outstanding alarms.

11. A computing device in accordance with claim 9, wherein to display an indication of which test conditions are satisfied, said presentation interface is configured to:
- display satisfied test conditions with a first indicator; and
- display unsatisfied test conditions with a second indicator.

12. A computing device in accordance with claim 9, wherein said presentation interface is further configured to guide the user through a troubleshooting process when the redundancy test fails.

13. A computing device in accordance with claim 9, wherein said presentation interface is further configured to:
- display a message indicating the redundancy test failed; and
- display a message indicating the redundancy test was successfully completed.

14. A computing device in accordance with claim 9, wherein said presentation interface is further configured to display information that indicates why the redundancy test failed.

15. A computing device in accordance with claim 9, wherein the redundancy test determines whether the plurality of controllers are capable of maintaining safe and continuous operation of the control system in the event of one or more faults within the control system.

16. A method for assisting a user in performing a redundancy test on a plurality of controllers in a control system, said method comprising:
- determining, using a processing device, whether a plurality of test conditions are satisfied;
- displaying to the user, on a presentation interface coupled to the processing device, an indication of which test conditions are satisfied; and
- receiving, at a user input interface coupled to the processing device, input from the user that initializes testing of the plurality of controllers.

17. A method in accordance with claim 16, wherein determining whether a plurality of test conditions are satisfied comprises:
- determining whether a pre-defined system configuration is complete; and
- determining whether there are any outstanding alarms.

18. A method in accordance with claim 16, wherein displaying an indication of which test conditions are satisfied comprises:
- displaying satisfied test conditions with a first indicator; and
- displaying unsatisfied test conditions with a second indicator.

19. A method in accordance with claim 16, further comprising guiding the user through a troubleshooting process when the redundancy test fails.

20. A method in accordance with claim 16, further comprising one of:
- displaying a message indicating the redundancy test failed when the redundancy test indicates that the plurality of controllers are not capable of maintaining safe and continuous operation in the event of one or more faults within the control system; and
- displaying a message indicating the redundancy test was successfully completed when the redundancy test indicates that the plurality of controllers are capable of maintaining safe and continuous operation in the event of one or more faults within the control system.

* * * * *